United States Patent [19]

Tomiya et al.

[11] Patent Number: 4,737,597

[45] Date of Patent: Apr. 12, 1988

[54] SHIELD CASE

[75] Inventors: Chikamasa Tomiya; Noriyuki Matsushima, both of Tokyo, Japan

[73] Assignee: Iwatsu Electric Co., Ltd., Tokyo, Japan

[21] Appl. No.: 857,213

[22] Filed: Apr. 28, 1986

[30] Foreign Application Priority Data

Aug. 9, 1985 [JP] Japan ............................ 60-123188[U]

[51] Int. Cl.$^4$ ............................................. H05K 9/00
[52] U.S. Cl. .................................... 174/35 R; 361/424
[58] Field of Search ................ 174/35 R, 35 MS File; 361/424; 333/12; 334/85; 330/68; 331/67; 329/174; 455/300, 301

[56] References Cited

U.S. PATENT DOCUMENTS

| | | | |
|---|---|---|---|
| 1,641,395 | 9/1927 | Moore | 455/301 X |
| 2,921,523 | 1/1960 | Larsen | 455/301 X |
| 4,370,515 | 1/1983 | Donaldson | 174/35 R |
| 4,510,345 | 4/1985 | Costa et al. | 174/35 R |

Primary Examiner—Arthur T. Grimley
Assistant Examiner—David A. Tone
Attorney, Agent, or Firm—Martin A. Farber

[57] ABSTRACT

A shield case consists of a case member for housing an electronic circuit. The case member consists of a single printed wiring board having first and second copper films formed on two major surfaces thereof. The first copper film serves as an outer surface coating of the case and is connected to a frame ground terminal. The second copper film serves as an inner surface coating of the case and is connected to a signal ground terminal.

3 Claims, 1 Drawing Sheet

SHIELD CASE

BACKGROUND OF THE INVENTION

The present invention relates to a shield case for housing an electronic circuit-mounting printed circuit board by utilizing double shield noise reduction.

Electronic circuits such as controllers are surface-mounted on a printed circuit board, and the printed circuit board is housed in a case. The case is connected to a control board or grounded to protect and insulate the electronic circuits from electrostatic noise, electromagnetic interference (EMI) and power source noise. Signal ground terminals of the electronic circuits are connected to a common ground terminal in the case.

In order to improve anti-noise characteristics, conventional cases employ a double shield structure. The case has a metal plate for guaranteeing mechanical strength and a shield plate mounted on the metal plate to achieve double insulation. Therefore, the structure is complicated, and assembly is cumbersome. When an inexpensive iron series material is used to constitute the metal plate, the potential gradient often becomes large due to electrostatic noise. Hence, a good double shield effect cannot be provided.

SUMMARY OF THE INVENTION

It is an object of the present invention to provide a shield case wherein a double shield structure can be simplified while anti-noise characteristics are improved.

In order to achieve the above object of the present invention, there is provided a shield case comprising a case element, the shield case housing an electronic circuit. The case element comprising a printed wiring board having first and second copper films formed on two major surfaces thereof, the first copper film being adapted to serve as an outer surface coating of the case and being connected to a frame ground terminal, and the second copper film being adapted to serve as an inner surface coating of the case and being connected to a signal ground terminal.

DETAILED DESCRIPTION OF THE PREFERRED EMBODIMENT

Figure 1:
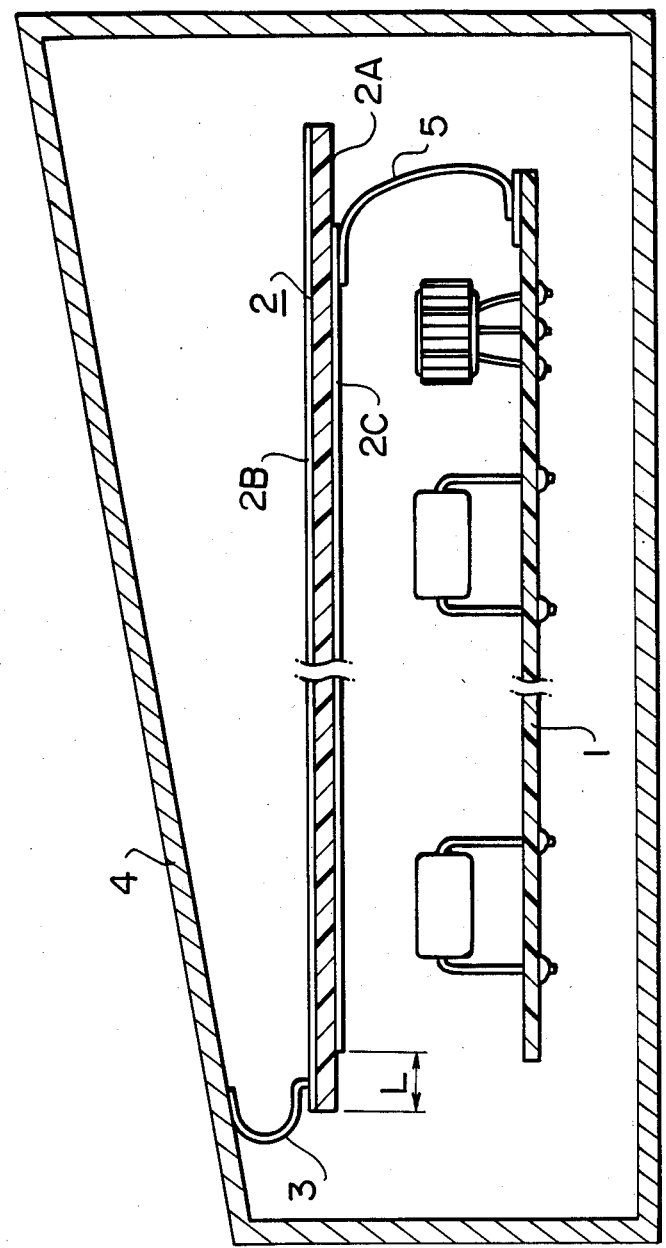
FIG. 1 is a side sectional view of a main part of a shield case according to an embodiment of the present invention.

Referring to the drawing, a case element of a printed circuit board 1 having electronic circuits thereon comprises a printed wiring board 2 obtained by forming copper films 2B and 2C on two major surfaces of a substrate 2A such as a glass epoxy board. The copper film 2B, serving as the outer surface coating of the case, is connected to a metal box 4 through a connecting member 3 such as a copper wire or a gasket and is frame-grounded. The copper film 2C, serving as the inner surface coating of the case, is connected at a single point to a ground terminal of the printed circuit board, a connector on the printed circuit board, and a ground terminal of a power source, thereby providing signal ground.

The end portions of the copper film 2C are removed from the end faces of the substrate 2A so that a distance L is guarateed, thus preventing discharge from the copper film 2B.

In the double shield structure of this type, electrostatic noise applied to the case (e.g., an operator accidentally touching the copper film 2B serving as the outer surface coating of the case), and external source noise (e.g., electromagnetic and power source noise from a motor, a thyristor converter, and a power source which are arranged in a control board) are shielded by the copper film 2B. Electromagnetic waves from the lead copper film and large-current and high-frequency elements in the electronic circuit on the printed circuit board are shielded by the copper film 2C. As a result, noise induction to the printed circuit board and to electronic circuits on other printed circuit boards can be reduced.

According to the present invention, one of the copper films on the printed wiring board serves as frame ground, and the other serves as signal ground. Double shielding can be achieved while noise is reduced. In this case, only one printed wiring board is required as a case member, thereby simplifying the structure.

What is claimed is:
1. A shield case comprising a frame ground terminal and a case element, the shield case housing an electronic circuit, said case element comprising a printed wiring board having first and second copper films formed on two major surfaces thereof, said first copper film being adapted to serve as an outer surface coating of said case and being connected to the frame ground terminal, and said second copper film being adapted to serve as an inner surface coating of said case and being connected to a signal ground terminal of said circuit; and wherein
    said first copper film is formed on an entire outer surface of said printed wiring board, and said second copper film is formed on an inner surface of said printed wiring board except for end portions thereof so as to prevent discharge from said first film.
2. A case according to claim 1, wherein said printed wiring board comprises a glass epoxy board.
3. A case according to claim 2, wherein said first and second copper films are connected to said frame and signal ground terminals, respectively, through connecting members.

* * * * *